(12) United States Patent
Moon et al.

(10) Patent No.: US 9,865,453 B2
(45) Date of Patent: Jan. 9, 2018

(54) SEMICONDUCTOR DEVICES INCLUDING DEVICE ISOLATION STRUCTURES AND METHODS OF MANUFACTURING THE SAME

(71) Applicant: Samsung Electronics Co., Ltd., Suwon-si (KR)

(72) Inventors: Daehyun Moon, Suwon-si (KR); HyeoungWon Seo, Yongin-si (KR); Ilgweon Kim, Hwaseong-si (KR); Jooyoung Lee, Hwaseong-si (KR); Dongjin Jung, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/191,581

(22) Filed: Jun. 24, 2016

(65) Prior Publication Data

US 2017/0018552 A1    Jan. 19, 2017

(30) Foreign Application Priority Data

Jul. 17, 2015    (KR) .................. 10-2015-0101730

(51) Int. Cl.
*H01L 21/762*    (2006.01)
*H01L 21/76*    (2006.01)
(Continued)

(52) U.S. Cl.
CPC .... *H01L 21/02164* (2013.01); *H01L 21/0228* (2013.01); *H01L 21/02238* (2013.01); *H01L 21/76224* (2013.01); *H01L 21/76229* (2013.01); *H01L 27/10814* (2013.01); *H01L 27/10823* (2013.01); *H01L 27/10855* (2013.01);
(Continued)

(58) Field of Classification Search
CPC ......... H01L 21/76224; H01L 21/76227; H01L 21/76229; H01L 21/31612; H01L 21/02164; H01L 21/32105; H01L 27/10894; H01L 27/1052; H01L 27/11524;
(Continued)

(56) References Cited

U.S. PATENT DOCUMENTS 6,693,008 B1 *  2/2004  Sato .................. H01L 21/76229
                                                    257/E21.548
8,748,286 B2    6/2014  Na et al.
(Continued)

FOREIGN PATENT DOCUMENTS

KR    10-1999-0057294    7/1999
KR    10-2006-0035234    4/2006
(Continued)

*Primary Examiner* — Marvin Payen
*Assistant Examiner* — Jeremy Joy
(74) *Attorney, Agent, or Firm* — Muir Patent Law, PLLC

(57) ABSTRACT

A method of manufacturing a semiconductor device includes forming a plurality of recess regions on an upper surface of a substrate, forming a first oxide layer in the recess regions, forming a polysilicon layer on the first oxide layer, forming a second oxide layer by oxidizing the polysilicon layer, and forming a gap-fill layer on the second oxide layer to fill the recess regions, wherein at least a portion of the polysilicon layer remains between the first oxide layer and the second oxide layer after forming the second oxide layer.

15 Claims, 13 Drawing Sheets

(51) Int. Cl.
*H01L 21/02* (2006.01)
*H01L 27/108* (2006.01)
*H01L 29/06* (2006.01)

(52) U.S. Cl.
CPC .. *H01L 27/10876* (2013.01); *H01L 27/10885* (2013.01); *H01L 27/10888* (2013.01); *H01L 27/10897* (2013.01); *H01L 29/0649* (2013.01)

(58) Field of Classification Search
CPC ......... H01L 27/11526; H01L 27/11531; H01L 29/0649; H01L 27/10876
See application file for complete search history.

(56) References Cited

U.S. PATENT DOCUMENTS

| | | | | |
|---|---|---|---|---|
| 2002/0022308 A1* | 2/2002 | Ahn | ............... | H01L 21/02238 438/164 |
| 2002/0127818 A1* | 9/2002 | Lee | ............... | H01L 21/76224 438/424 |
| 2004/0014291 A1* | 1/2004 | Mehrad | ............ | H01L 21/76224 438/296 |
| 2004/0051159 A1* | 3/2004 | Terashima | ........ | H01L 21/76224 257/506 |
| 2005/0085048 A1 | 4/2005 | Hsiao | | |
| 2005/0186755 A1* | 8/2005 | Smythe | ............ | H01L 21/76224 438/424 |
| 2005/0255669 A1 | 11/2005 | Kang et al. | | |
| 2006/0046425 A1* | 3/2006 | Sandhu | ............... | H01L 27/1052 438/424 |
| 2007/0210403 A1* | 9/2007 | Sandhu | ............ | H01L 21/76229 257/499 |
| 2014/0159193 A1* | 6/2014 | Kim | .................... | H01L 29/0649 257/513 |
| 2015/0294923 A1* | 10/2015 | Shin | ..................... | H01L 23/481 257/532 |

FOREIGN PATENT DOCUMENTS

| | | |
|---|---|---|
| KR | 10-2007-0072684 | 7/2007 |
| KR | 10-2008-0029524 | 4/2008 |
| KR | 10-2010-0078251 | 7/2010 |
| KR | 10-1082090 | 11/2011 |

* cited by examiner

SEMICONDUCTOR DEVICES INCLUDING DEVICE ISOLATION STRUCTURES AND METHODS OF MANUFACTURING THE SAME

CROSS-REFERENCE TO RELATED APPLICATIONS

This U.S. non-provisional patent application claims priority under 35 U.S.C. §119 to Korean Patent Application No. 10-2015-0101730, filed on Jul. 17, 2015, in the Korean Intellectual Property Office (KIPO), the contents of which are herein incorporated by reference in their entirety.

BACKGROUND

1. Technical Field

The present disclosure relates to semiconductor devices including device isolation structures and methods of manufacturing the same.

2. Description of the Related Art

Recently, semiconductor devices including a plurality of device isolation structures have become highly integrated. Therefore, the device isolation structures become one of many elements that may have an effect on a reliability of the semiconductor devices.

SUMMARY

In certain example embodiments of the inventive concepts, a method of manufacturing a semiconductor device includes forming a plurality of recess regions on an upper surface of a substrate, forming a first oxide layer in the recess regions, forming a polysilicon layer on the first oxide layer, forming a second oxide layer by oxidizing the polysilicon layer, and forming a gap-fill layer on the second oxide layer to fill the recess regions. At least a portion of the polysilicon layer remains between the first oxide layer and the second oxide layer after forming the second oxide layer.

In some embodiments, the first oxide layer may be formed by using an atomic layer deposition process.

In some embodiments, the first oxide layer may have a first thickness and the second oxide layer may have a second thickness greater than the first thickness.

In some embodiments, the substrate may comprise a cell array region and a peripheral circuit region. The recess regions may include a first recess region in the cell array region and a second recess region in the peripheral circuit region. The first recess region may include a plurality of active regions extending in a first direction and include recesses between the active regions, wherein a maximum distance between active regions in either the first direction or a second direction perpendicular to the first direction is a first width, and the second recess region may include a plurality of active regions and at least one recess therebetween, and a minimum distance between active regions is a second width greater than the first width.

In some embodiments, the method may further comprise forming a first device isolation structure in the first recess region and a second device isolation structure in the second recess region. The first device isolation structure may comprise the first oxide layer, the second oxide layer, and the gap-fill layer. The second device isolation structure may comprise the first oxide layer, at least a portion of the polysilicon layer, the second oxide layer, and the gap-fill layer.

In some embodiments, the portion of the polysilicon layer may have an isolated structure between the first oxide layer and the second oxide layer. At least a portion of the first oxide layer may contact the second oxide layer in the second recess region.

In some embodiments, the cell array region may comprise a plurality of first active regions divided by the first device isolation structure. The first recess region may have a wide width region and a narrow width region. The wide width region may have a first space between adjacent ones of the first active regions, and the narrow width region may have a second space between adjacent ones of the first active regions. The second space may be smaller than the first space.

In some embodiments, the wide width region may extend in the first direction, and the narrow width region may extend in the second direction.

In some embodiments, the narrow width region of the first recess region may be filled by the first oxide layer and the second oxide layer. The wide width region of the first recess region may be filled by the first oxide layer, the second oxide layer, and the gap-fill layer.

In some embodiments, the method may further comprise forming a plurality of capacitors electrically connecting to the first active regions.

In some embodiments, the method may further comprise forming a plurality of word lines crossing the first active regions and forming a plurality of bit lines crossing the word lines. The bit lines may electrically connect to the first active regions and the word lines may be embedded in the substrate.

In certain example embodiments of the inventive concepts, a method of manufacturing a semiconductor device includes providing a substrate including a cell array region and a peripheral circuit region, forming a first recess region in the cell array region, the first recess region defining a plurality of first active regions that extend in a first direction and are formed to be parallel to each other, forming a first oxide layer in the first recess region using an atomic layer deposition process, forming a polysilicon layer on the first oxide layer, the polysilicon layer at least partially filling the first recess region, forming a second oxide layer by oxidizing the polysilicon layer, and forming a gap-fill layer on the second oxide layer. The first recess region may include a wide width region and a narrow width region. The wide width region may have a first space between adjacent ones of the first active regions and the narrow width region may have a second space between adjacent ones of the first active regions. The second space may be smaller than the first space. The narrow width region may be filled by the first oxide layer and the second oxide layer. The wide width region may be filled by the first oxide layer, the second oxide layer, and the gap-fill layer, which is not included in the narrow width region.

In some embodiments, the wide width region extends in the first direction, and the narrow width region extends in a second direction. The second direction may extend perpendicular to the first direction.

In some embodiments, the oxidizing the polysilicon layer may be performed by using an ISSG (In-situ Steam Generation) process.

In some embodiments, the gap-fill layer may include a TOSZ (Tonen Silazene) oxide layer.

In some embodiments, the at least a portion of the polysilicon layer may remain between the first oxide layer and the second oxide layer after forming the second oxide layer.

In some embodiments, the method may further comprise forming a plurality of word lines crossing the first active regions in the substrate, forming a plurality of capacitors electrically connecting to the first active regions, and forming a plurality of bit lines crossing the word lines. The bit lines may electrically connect to the first active regions.

In some embodiments, the method may further comprise forming a second recess region in the peripheral circuit region. The second recess region may be filled by the first oxide layer, the second oxide layer, and the gap-fill layer.

In some embodiments, the at least a portion of the polysilicon layer may remain between the first oxide layer and the second oxide layer after forming the second oxide layer.

In certain example embodiments, a method includes providing a substrate; providing a plurality of recess regions on an upper surface of a substrate; providing a first oxide layer in the recess regions; providing an oxidized polysilicon layer on the first oxide layer, the oxidized polysilicon layer being a second oxide layer; and providing a gap-fill layer on the second oxide layer to fill the recess regions. At least a portion of the polysilicon layer that is not oxidized may remain between the first oxide layer and the second oxide layer.

In some embodiments, the substrate comprises a cell array region and a peripheral circuit region, the recess regions include a first recess region in the cell array region and a second recess region in the peripheral circuit region, and the first recess region includes a plurality of active regions extending in a first direction and includes recesses between the active regions. The second recess region may include a plurality of active regions and at least a one recess therebetween, the recess in the second recess region having a greater width than any of the recesses in the first recess region.

In certain example embodiment of the inventive concepts, a semiconductor device includes a substrate including a cell array region and a peripheral circuit region, a first recess region in the cell array region, the first recess region defining a plurality of first active regions, a first device isolation structure in the first recess region, a second recess region in the peripheral region, the second recess region defining a plurality of second active regions, a second device isolation structure in the second recess region, and a plurality of capacitors electrically connecting to the first active regions. The first recess region may include a wide width region and a narrow width region. The wide width region may have a first space between adjacent ones of the first active regions and the narrow width region may have a second space between adjacent ones of the first active regions. The second space may be smaller than the first space. The wide width region may be filled by a first number of insulative layers and the narrow width region may be filled by a second number of insulative layers. The second number being less than the first number.

In some embodiments, the first number may be an integer n. The integer n may be greater than 2 and the second number may be n–1.

In some embodiments, the second recess region may be filled by the first number of insulative layers.

In some embodiments, the second device isolation structure may include a first oxide layer on the substrate, a polysilicon layer on the first oxide layer, and a second oxide layer on the polysilicon layer.

In some embodiments, the polysilicon layer may have an isolated structure between the first oxide layer and the second oxide layer. At least a portion of the first oxide layer may directly contact with the second oxide layer.

In some embodiments, the plurality of first active regions may extend in a first direction. The wide width region of the first recess region may extend in the first direction, and the narrow width region of the first recess region may extend in a second direction. The second direction extending perpendicularly from the first direction.

In some embodiments, the second device isolation structure may include a first oxide layer, a second oxide layer, and a gap-fill layer. The first device isolation structure of the narrow width region may include the first oxide layer and the second oxide layer and does not include the gap-filled layer.

In some embodiments, the semiconductor device may further comprise a polysilicon layer between the first oxide layer and the second oxide layer in the second device isolation structure.

In some embodiments, the polysilicon layer may have an isolated structure. At least a portion of the first oxide layer may directly contact with the second oxide layer.

In some embodiments, the semiconductor device may further comprise a polysilicon layer between the first oxide layer and the second oxide layer in the narrow width region.

In some embodiments, the polysilicon layer may have an isolated structure. At least a portion of the first oxide layer may directly contact with the second oxide layer.

In some embodiments, the first device isolation structure of the wide width region may include a first oxide layer, a second oxide layer, and a gap-fill layer.

In some embodiments, the gap-fill layer may be thicker than the second oxide layer and the second oxide layer may be thicker than the first oxide layer.

BRIEF DESCRIPTION OF THE DRAWINGS

The above aspects and features will become more apparent by describing in detail example embodiments thereof with reference to the attached drawings, in which.

DETAILED DESCRIPTION

Figure 1:
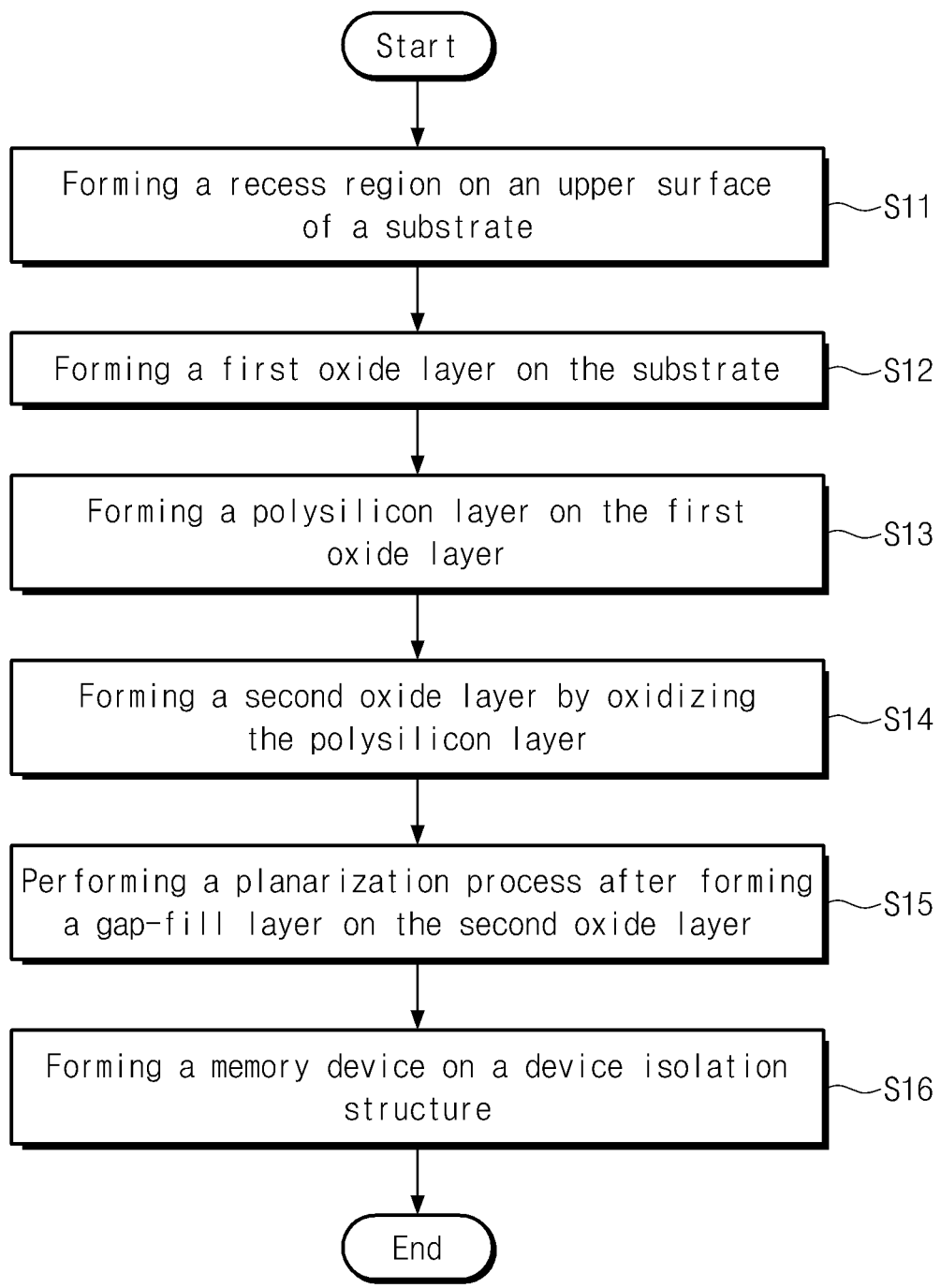
FIG. 1 is a flow chart illustrating a method of manufacturing a semiconductor device according to certain example embodiments.

Example embodiments will now be described more fully hereinafter with reference to the accompanying drawings; however, they may be embodied in different forms and should not be construed as limited to the examples set forth herein.

It will be understood that when an element is referred to as being "on," "connected" or "coupled" to another element, it can be directly on, connected or coupled to the other element or intervening elements may be present. In contrast, when an element is referred to as "contacting," or being "directly on," "directly connected" or "directly coupled" to another element, or as "contacting" or "in contact with" another element, there are no intervening elements present. Other words used to describe the relationship between elements or layers should be interpreted in a like fashion (e.g., "between" versus "directly between," "adjacent" versus "directly adjacent," "under" versus "directly under").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed in one part of the specification below could be termed a second element, component, region, layer or section in another part of the specification and/or in the claims, without departing from the teachings of example embodiments. In addition, certain terms may not be described in the specification using the terms "first," "second," etc., but may be labeled with such terms for naming purposes in the claims.

In the drawing figures, the dimensions of layers and regions may be exaggerated for clarity of illustration. Like reference numerals refer to like elements throughout. Unless noted otherwise, the same reference numbers indicate the same components throughout the specification.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. The term "consisting of," if used, is construed to be a closed-ended term.

Unless defined otherwise, all technical and scientific terms used herein have the same meaning as commonly understood by one of ordinary skill in the art. It is noted that the use of any and all examples, or example terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of the inventive concepts will be described in detail with reference to the accompanying drawings.

Figure 2:
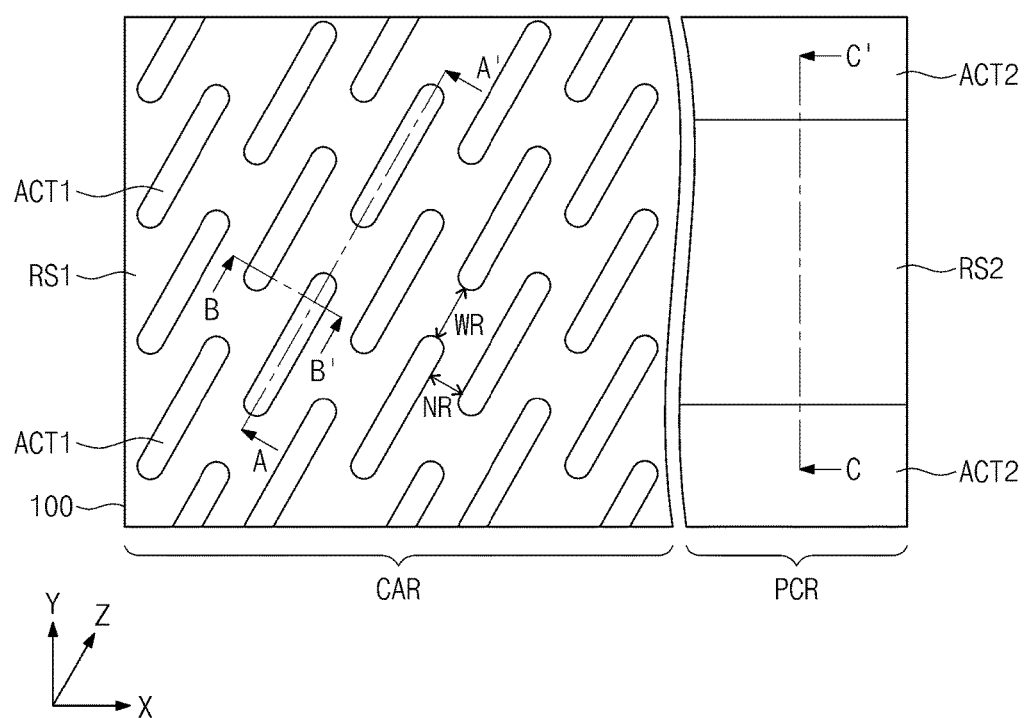
FIG. 2 is a plan view illustrating a method of manufacturing a device isolation structure according to certain example embodiments.

FIG. 1 is a flow chart illustrating a method of manufacturing a semiconductor device according to an example embodiment. FIG. 2 is a plan view illustrating a method of manufacturing a device isolation structure according to an example embodiment. FIGS. 3a, 4a, 5a, and 6a are cross-sectional views illustrating a method of manufacturing a device isolation structure taken along the lines A-A' and B-B' of FIG. 2. FIGS. 3b, 4b, 5b, and 6b are cross-sectional views illustrating a method of manufacturing a device isolation structure taken along the lines C-C' of FIG. 2.

As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIGS. 1, 2, 3a, and 3b, a recess region may be formed on an upper surface of a substrate 100 (S11). The substrate 100 may be, for example, a bulk silicon substrate, a silicon-on-insulator (501) substrate, a germanium substrate, a germanium-on-insulator (GeOI) substrate, a silicon-germanium substrate, or an epitaxial substrate that is formed using a selective epitaxial growth (SEG) process. The substrate 100 may include a cell array region CAR and a peripheral circuit region PCR. The cell array region CAR may include a plurality of memory cells. In some embodiments, each of the memory cells is a DRAM cell including a capacitor. The peripheral circuit region PCR may include at least one of a word-line driver, a sense amplifier, a plurality of row and column decoders, and/or a controller. The peripheral circuit region PCR may be disposed between each of a plurality of cell array regions CAR. In some embodiments, the peripheral circuit region PCR may be spaced apart from the cell array region CAR.

The recess region may be formed, for example, by using an anisotropic etching process after forming a mask pattern on the substrate 100. The recess region may include a first recess region RS1 in the cell array region CAR and a second recess region RS2 in the peripheral circuit region PCR. The first recess region RS1 may define a plurality of first active regions ACT1 in the cell array region CAR. In some embodiments, the first active regions ACT1 may each be a bar-type extending in a direction (Z-direction) and being parallel to each other and/or in line with each other.

When viewed from certain cross-sections, the first recess region RS1 may be described as including a plurality of recesses, for example, separated from each other by active regions.

Figure 3A:
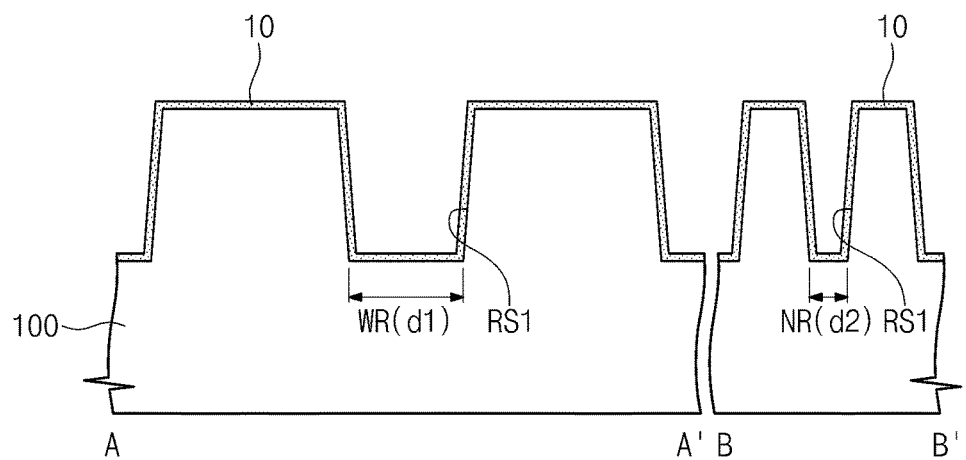
FIGS. 3a, 4a, 5a, and 6a are cross-sectional views illustrating a method of manufacturing a device isolation structure taken along the lines A-A' and B-B' of FIG. 2, according to certain example embodiments.
Figure 3B:
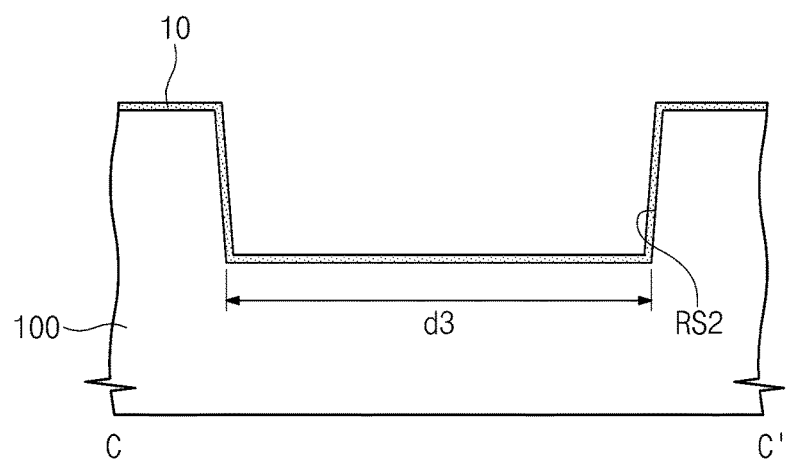
FIGS. 3b, 4b, 5b, and 6b are cross-sectional views illustrating a method of manufacturing a device isolation structure taken along the lines C-C' of FIG. 2, according to certain example embodiments.
Figure 4A:
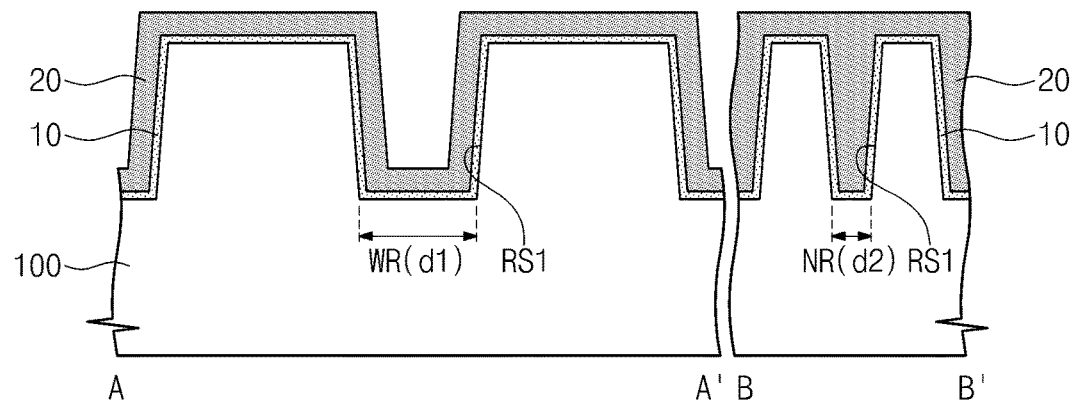
Figure 4B:
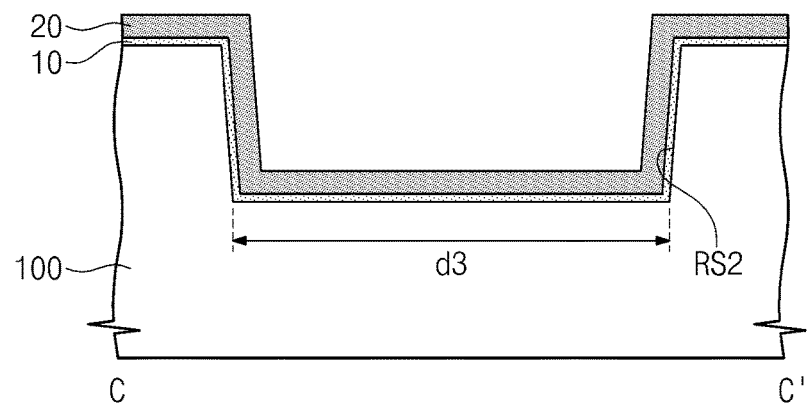
Figure 5A:
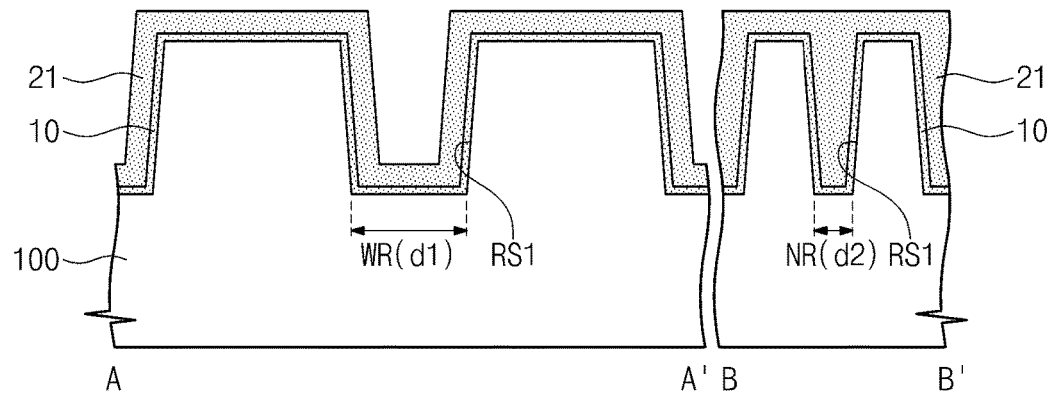
Figure 5B:
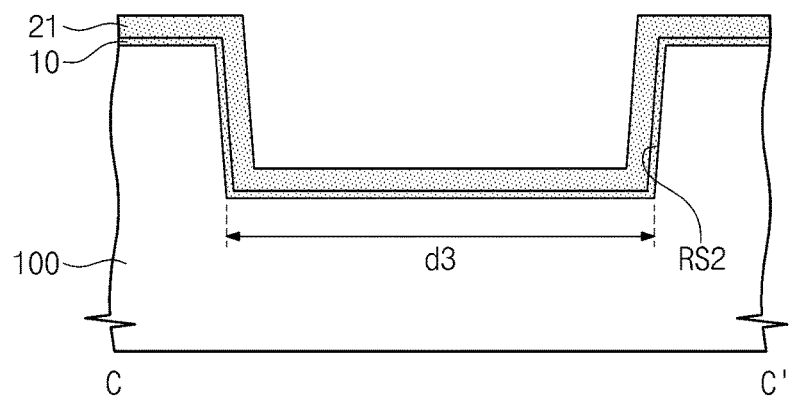

The first recess region RS1 may include a wide width region WR having a first width d1 and a narrow width region NR having a second width d2. The wide width region WR may have a maximum space between adjacent active regions of the first active regions ACT1 (e.g., maximum space from among the direction in which the active regions extend and a direction perpendicular thereto) and the narrow width region NR may have a minimum space between adjacent the first active regions ACT1 (e.g., minimum space from among the direction in which the active regions extend and a direction perpendicular thereto). The first width d1, which may be a distance between two adjacent first active regions ACT1 in a direction in which the first active regions ACT1 extend, may be greater than the second width d2, which may be a distance between two adjacent first active regions ACT1 in a direction perpendicular to the direction in which the first active regions ACT1 extend. In some embodiments, the first width d1 may be about 1.5 times to about 5 times the second width d2. The wide width region WR may be a space between adjacent active regions of the first active regions ACT1 extending along the Z-direction. In some embodiments, a width of a bottom surface of a recess of the first recess region RS1 in the Z-direction may have the first width d1 as shown in FIG. 3a that is a cross-sectional view taken along the line A-A'. In some embodiments, a width of a bottom surface of a recess of the first recess region RS1 in a direction perpendicular to the Z-direction may have the second width d2 as shown in FIG. 3a that is a cross-sectional view taken along the line B-B'. The line B-B' shown in FIG. 2 is perpendicular to the line A-A'.

The second recess region RS2 may include a recess having a third width d3 between active regions ACT2 greater than the first width d1 of the wide width region WR and/or the second width d2 of the narrow width region NR. The second recess region RS2 may be a space between a pair of adjacent active regions of the second active regions ACT2 extending in a direction (X-direction). However, it shall not be restricted or limited thereto. In some embodiments, the second active regions ACT2 may be extended in a different direction, e.g., Y-direction, Z-direction, or other directions, and a shortest width of a recess of the second recess region RS2 between two active regions of the second active regions ACT2 may be greater than the first width d1 of the wide width region WR and/or the second width d2 of the narrow width region NR. Therefore, in one embodiment, the first recess region RS1 includes a plurality of active regions ACT1 extending in a first direction and includes recesses between the active regions, wherein a maximum distance between active regions in either a first direction (Z-direction) or a second direction perpendicular to the first direction is a first width, and the second recess region RS2 includes a plurality of active regions ACT2 and at least one recess therebetween, and a minimum distance between active regions ACT2 is a second width greater than the first width.

The first and second recess regions RS1 and RS2 may be simultaneously formed by a same process. The comparative widths described in this example (d1, d2, and d3) may all be widths measured at a same vertical height. As such, the width relationships described above may apply to widths of the recesses measured at a bottom surface of the recesses, and may also apply to widths of the recesses measured at a middle height of the recesses, or at a top of the recesses.

A first oxide layer 10 may be formed on the substrate 100 (S12). In certain embodiments, the first oxide layer 10 may be conformally formed along an upper surface of the substrate 100 on which the first and second recess regions RS1 and RS2 are formed. The first oxide layer 10 may not fully fill the first and second recess regions RS1 and RS2. The first oxide layer 10 may be formed, for example, by using an atomic layer deposition (ALD) process. In some embodiments, a method of forming the first oxide layer 10 may include loading a wafer having a plurality of recess regions into an ALD chamber and supplying source gases repeatedly to the ALD chamber. The source gases may include a silicon source gas, e.g., silane, and an oxygen source gas, e.g., $O_2$. A supply of the silicon source gas and a supply of the oxygen source gas may be included in a cycle. The first oxide layer 10 may be formed by performing a plurality of the cycles. The cycle may include performing purging the chamber using an inert gas between the supply of the silicon source gas and the supply of the oxygen source gas. In certain embodiments, the first oxide layer 10 may have a particular thickness. For example, the thickness may be in a range between about 30 angstroms (Å) to about 150 angstroms (Å). For example, in some embodiments, the oxide layer 10 may have a substantially uniform thickness between 30 angstroms (Å) and 150 angstroms (Å).

The distance between a plurality of active regions as well as the area consumed by each active region of the plurality of active regions in a cell array region has been dramatically reduced in accordance with design rules of a reduced-size semiconductor device. In contrast to a thermal oxidation process, which oxidizes a portion of the substrate 100, the ALD process may not consume the substrate 100. Thereby, the first oxide layer 10 may be a portion of a device isolation structure without consumption of any area of the first active regions ACT1. For example, because the first oxide layer 10 is deposited on the substrate, instead of being formed of part of the substrate (e.g., an oxidized part), the full area of the substrate (from a plan view, as well as from cross-sectional views) remains, and so the size of the active area remains the same after the first oxide layer 10 is formed as it was before the first oxide layer 10 was formed.

Referring to FIGS. 1, 2, 4a, and 4b, a polysilicon layer 20 may be formed on the first oxide layer 10 (S13). In some embodiments, the polysilicon layer 20 may be formed by using a chemical vapor deposition (CVD) process. The polysilicon layer 20 may be thicker than the first oxide layer 10. In some embodiments, the thickness of the polysilicon layer 20 may be from about 2 times to about 10 times of the thickness of the first oxide layer 10. For example, in some embodiments, the polysilicon layer 20 may have a substantially uniform thickness between 2 times the thickness of the first oxide layer 10 and 10 times the thickness of the first oxide layer. The polysilicon layer 20 may be conformally formed on upper surfaces of the substrate 100 and the first and second recess regions RS1 and RS2. In certain embodiments, the polysilicon layer 20 does not fully fill the first recess region RS1 in the wide width region WR (e.g., it does not fully fill recesses having the width d1, such as those between adjacent active regions ACT1 in the Z-direction). In certain embodiments, the polysilicon layer 20 fully fills the first recess region RS1 in the narrow width region NR (e.g., it does fully fill recesses, from the bottom to the top of the recess, having the width d2, such as those between adjacent active regions ACT1 in a direction perpendicular to the Z-direction). The polysilicon layer 20 may not fully fill the second recess region RS2.

Referring to FIGS. 1, 2, 5a, and 5b, a second oxide layer 21 may be formed by oxidizing the polysilicon layer 20 using an oxidation process (S14). In some embodiments, the oxidation process may be an in-situ steam generation (ISSG) process. The ISSG process may be performed in an ambient of water vapor ($H_2O$), oxygen radical ($O_2$—), and hydroxyl group (OH—). The ISSG process may be performed in a temperature range of about 950° C. to about 1050° C. and in a pressure range of about 7.5 to about 20 Torr. The ISSG process may be performed immediately after deposition of the polysilicon layer 20, for example, without removing the substrate 100 from a chamber, and without performing an intermediate process (e.g., cleaning, etc.).

The polysilicon layer 20 may be fully oxidized and become the second oxide layer 21. However, it shall not be restricted or limited thereto. In some embodiments, only a portion of the polysilicon layer 20 may be oxidized and the other portion of the second polysilicon layer 20 may remain between the first oxide layer 10 and the second oxide layer 21.

Referring to FIGS. 1, 2, 6a, and 6b, a planarization process may be performed after forming a gap-fill layer on the second oxide layer 21 (S15). Thereby, a first device isolation structure IS1 which includes the first oxide layer 12 (which is a portion of the previously described first oxide layer 10), the second oxide layer 22 (which is a portion of the previously described second oxide layer 21), an optional polysilicon layer therebetween (not shown), and the gap-fill layer 42, may be formed in the cell array region CAR, and a second device isolation structure IS2 which includes the first oxide layer 13 (which is a portion of the previously described first oxide layer 10), the second oxide layer 23 (which is a portion of the previously described second oxide layer 21), an optional polysilicon layer therebetween (not shown), and the gap-fill layer 43 may be formed in the peripheral circuit region PCR. In certain embodiments, the gap-fill layers 42 and 43 may be formed by using a flowable material. For example, the gap-fill layers 42 and 43 may be a tonen silazene (TOSZ) oxide layer. In some embodiments, the method of forming the gap-fill layers 42 and 43 may include forming a TOSZ layer on the substrate 100 and baking the TOSZ layer in a temperature. In some embodiments, the baking temperature may be about 50° C. to about 400° C.

In some embodiments, the gap-fill layers 42 and 43 may include an insulative material including at least one of HDP-CVD (high density plasma-CVD) oxide, TEOS (tetra-ethyl-ortho-silicate), PE-TEOS (plasma enhanced tetra-ethyl-ortho-silicate), O3-TEOS (ozone-tetra-ethyl-ortho-silicate), USG (undoped silicate glass), PSG (phospho-silicate glass), BPSG (boro-phospho-silicate glass), FSG (fluoride silicate glass), and/or SOG (spin on glass).

In some embodiments, the planarization process may be a CMP (chemical mechanical polishing) process. Upper surfaces of the substrate 100, e.g., upper surfaces of the first and second active regions ACT1 and ACT2, may be exposed after the planarization process.

According to certain example embodiments, the cell array region CAR may include the first device isolation structure IS1 and the peripheral circuit region PCR may include the second device isolation structure IS2. The first isolation structure IS1 may have different vertical structures or portions according to a horizontal location on the substrate 100. For example, a number of oxide layers of the first device isolation structure IS1 in the narrow width region NR may be less than a number of oxide layers of the first device isolation structure IS1 in the wide width region WR. In some embodiments, the wide width region may be filled by a first number of oxide layers and the narrow width region may be filled by a second number of oxide layers. The second number may be less than the first number. In some embodiments, the first number may be an integer n that is greater than 2 and the second number may be n−1.

Figure 6A:
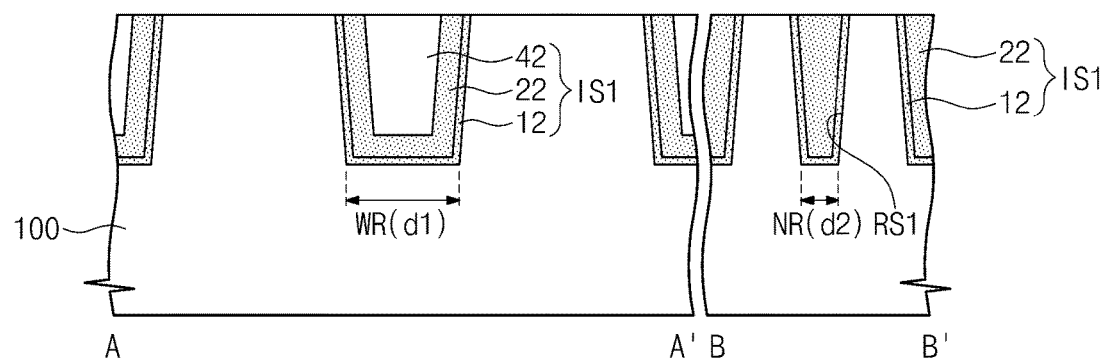
Figure 6B:
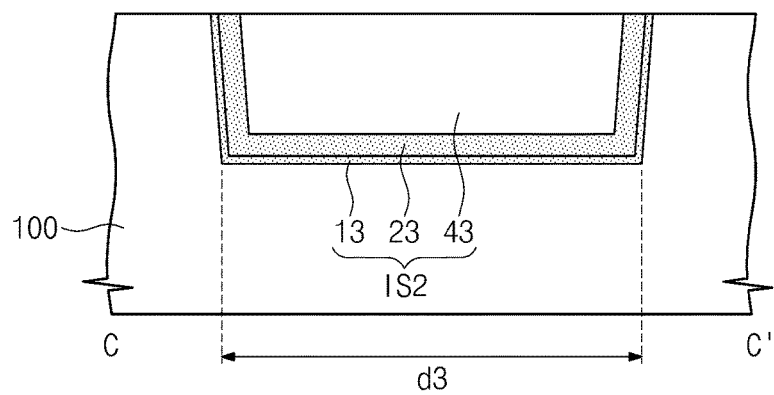

As shown in FIG. 6a, for example, the wide width region WR of the first recess region RS1 may be filled by the first oxide layer 12, the second oxide layer 22, and the gap-fill layer 42. However, the narrow width region NR of the first recess region RS1 may be filled by the first oxide layer 12 and the second oxide layer 22, i.e., there is no gap-fill layer in the narrow width region NR. In some embodiments, an uppermost surface (for example, more than 50% of the uppermost surface) of the first device isolation structure IS1 may include the gap-fill layer 42 in the wide width region WR. However, in some embodiments, an uppermost surface of the first device isolation structure IS1 may include the second oxide layer 22 in the narrow width region NR without including the gap-fill layer 42 (or in some cases, is less than 50% formed of the gap-fill layer 42). As a result of the above processes, in some embodiments, from a plan view, the gap-fill layer 42 includes a plurality of separated portions or structure, each having a spool shape.

As shown in FIG. 6a, the second device isolation structure IS2 may have the same vertical structure as the layers formed in the wide width region WR of the first device isolation structure 1S1. For example, the second device isolation structure IS2 may be filled by the first oxide layer 13, the second oxide layer 23, and the gap-fill layer 43. An uppermost surface (for example, more than 50% of the uppermost surface, and in some cases, more than 80%) of the second device isolation structure IS2 may be the gap-fill layer 43. In some embodiments, the second device isolation structure IS2 may include an additional oxide layer compared to that of the first device isolation structure IS1 in the wide width region WR of the first device isolation structure IS1, therefore, the second device isolation structure IS2 may be filled by a third number of oxide layers which is n+1. The additional oxide layer may include, for example, at least one of HDP-CVD (high density plasma-CVD) oxide, TEOS (tetra-ethyl-ortho-silicate), PE-TEOS (plasma enhanced tetra-ethyl-ortho-silicate), O3-TEOS (ozone-tetra-ethyl-ortho-silicate), USG (undoped silicate glass), PSG (phosphosilicate glass), BPSG (boro-phospho-silicate glass), FSG (fluoride silicate glass), and/or SOG (spin on glass).

Figure 7:
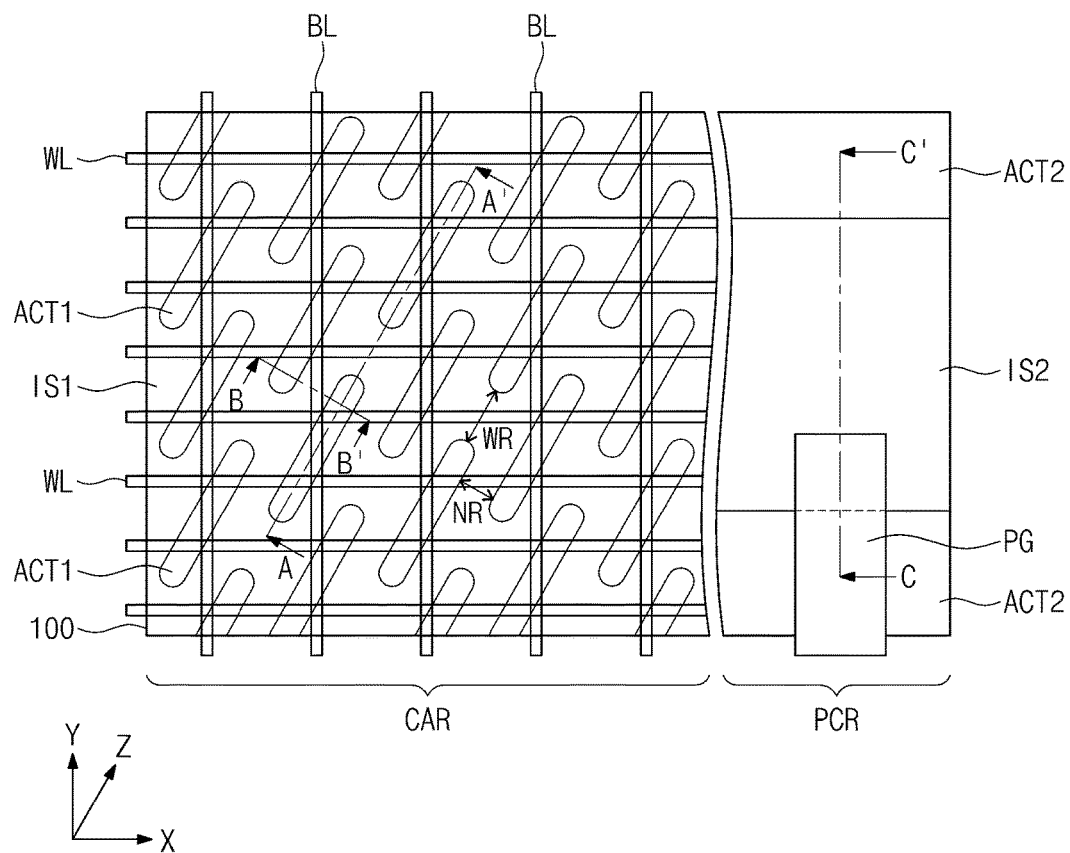
FIG. 7 is a plan view illustrating a memory device formed on a device isolation structure according to certain example embodiments.
Figure 8A:
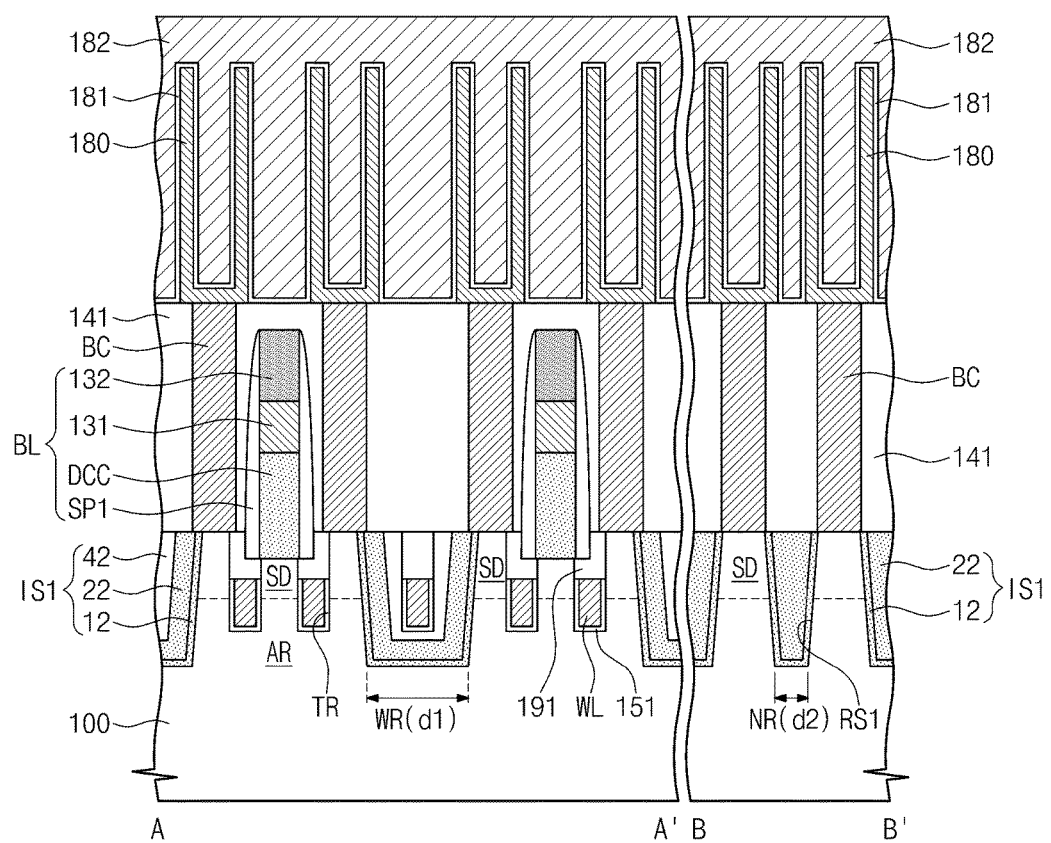
FIG. 8a is a cross-sectional view taken along the lines A-A' and B-B' of FIG. 7, according to certain example embodiments.
Figure 8B:
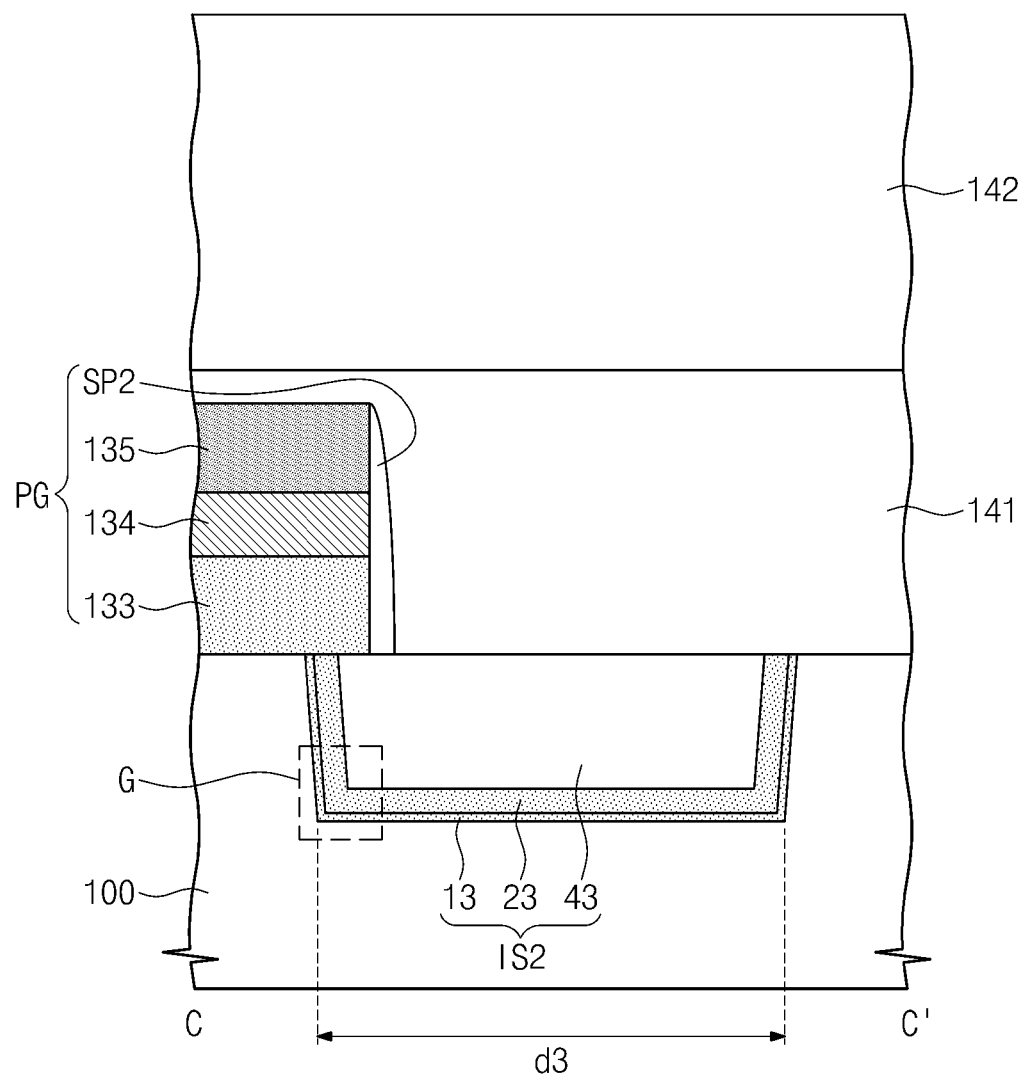
FIG. 8b is a cross-sectional view taken along the line C-C' of FIG. 7, according to certain example embodiments.

FIG. 7 is a plan view illustrating a memory device formed on a device isolation structure according to an example embodiment of the inventive concepts. FIG. 8a is a cross-sectional view taken along the lines A-A' and B-B' of FIG. 7. And FIG. 8b is a cross-sectional view taken along the line C-C' of FIG. 7.

Referring to FIGS. 1, 7, 8a, and 8b, a memory device may be formed on the substrate 100 in which the first and second device isolation structures IS1 and IS2 are formed. In some embodiments, the memory device may be a DRAM device. However, it shall not be restricted or limited thereto, e.g., the memory device may be a SRAM device, NAND device, or other memory devices.

A plurality of source/drain regions SD may be formed in an upper portion of each first active region ACT1, which is defined by the first device isolation structure IS1, in the cell array region CAR. The source/drain regions SD may be formed, for example, by an ion implantation process. The source/drain regions SD may have a different conductive type from the substrate 100. In some embodiments, the source/drain regions SD may include an n-type impurity region.

A plurality of trenches TR may be formed on an upper surface of the substrate 100. The trenches TR may extend in a first direction (X-direction) and a pair of trenches TR may cross each of active regions AR. The trenches may be parallel to each other. The trenches may be spaced apart from each other by a first distance in a Y direction which crosses the X-direction. A gate dielectric layer 151 may be conformally formed along a surface of the trenches TR. A plurality of word lines WL, which fill the trenches TR, may be formed on the gate dielectric layer 151. The gate dielectric layer may include an insulating layer, e.g., a silicon oxide layer, a silicon oxynitride layer, and/or a high-k dielectric layer. The word lines WR may include conductive material. In some embodiments, the word lines WR may include at least one of doped polysilicon, metal material, and/or conductive metal nitride.

Some upper portions of the gate dielectric layer 151 and the word lines WL which are formed in the trenches TR may be removed. A plurality of capping patterns 191 may be formed on the word lines WL. The capping patterns 191 may fully fill the trenches TR. The capping patterns 191 may include, for example, an insulative material such as at least of silicon oxide, silicon nitride, and/or silicon oxynitride.

In some embodiments, a buffer layer (not shown) may be formed on the substrate 100. The buffer layer may include one or more layers selected from the group of a silicon oxide layer, a silicon nitride layer, and/or a silicon oxynitride layer.

A plurality of bit lines BL that are electrically connected to the source/drain regions SD may be formed on the buffer layer formed on the substrate 100. The bit lines BL may include a conductive layer 131 and a capping layer 132. The bit lines BL may extend in the second direction (Y-direction) and cross the first active regions ACT1. Each of bit lines BL may be spaced apart from each other by a distance in the first direction (X-direction). If a buffer layer is not used, then the plurality of bit lines BL may be formed on the substrate 100 without a buffer layer.

Each of the bit lines BL may include a bit line contact DCC which may connect the conductive layer 131 to the source/drain region SD. The bit line contact DCC may be formed on the first active regions ACT1. The bit line contacts DCC and the conductive layer 131 may be formed by an etching process using the capping layer 132 as an etch mask. The bit line contacts may be formed of a conductive material.

A first spacer SP1 may be formed on sidewalls of the bit line contacts DCC, the conductive layer 131, and the capping layer 132. The first spacer SP1 may include one or more layers selected from the group of a silicon oxide layer, a silicon nitride layer, and/or a silicon oxynitride layer.

In some embodiments, the bit line contacts DCC may include doped polysilicon and the conductive layer 131 may include metal, e.g., tungsten (W), copper (Cu), nickel (Ni), and/or cobalt (Co). A diffusion barrier layer may be formed between the conductive layer 131 and the bit line contacts DCC. The diffusion barrier layer may include one or more layers selected from the group of titanium (Ti), titanium nitride (TiN), titanium silicon nitride (TiSiN), tantalum nitride (TaN), and/or tungsten nitride (WN). In some embodiments, the conductive layer 131 and the capping layer 132 may be formed by using a CVD process or a sputtering deposition process.

A first interlayer insulating layer 141 may be formed on the bit lines BL. A plurality of storage node contacts BC may be formed in the first interlayer insulating layer 141. The storage node contacts BC may be connected to the source/drain regions SD. The storage node contacts BC may include one or more conductive materials, e.g., doped polysilicon, metal material, and/or conductive metal nitride. In some embodiments, the storage node contacts BC may include tungsten (W) and tungsten nitride (W×N×-1). In some embodiments, the first interlayer insulating layer 141 may be a silicon oxide layer which is formed by using a CVD process. The storage node contacts may have a vertical, pillar shape, for example extending from the substrate 100 through the interlayer insulating layer 141.

A plurality of lower electrodes 180, a dielectric layer 181, and an upper electrode 182 may be sequentially formed on the first interlayer insulating layer 141. The lower electrodes 180, the dielectric layer 181, and the upper electrode 182 may form a capacitor of a semiconductor device. The lower electrode 180 may have a cylindrical shape, for which the bottom surface thereof may be closed. The method of forming the lower electrodes 180 may include forming a first sacrificial layer on the first interlayer insulating layer 141, forming a plurality of holes which expose an upper surface of the storage node contacts BC, conformally forming a conductive layer in the holes, forming a second sacrificial layer on the conductive layer to fill the holes, planarizing the second sacrificial layer to expose the first sacrificial layer, and removing the first and second sacrificial layers. A plurality of landing pads (not shown) may be formed between the storage node contacts BC and the lower electrodes 180, respectively. The landing pads may include one or more of metal, conductive metal nitride, and/or doped polysilicon.

The lower electrodes 180 and the upper electrode 182 may include a conductive material such as at least one of doped semiconductor material, conductive metal nitride, metal, and/or conductive metal oxide. The doped semiconductor material may include, for example, doped polysilicon. The conductive metal nitride may include, for example, titanium nitride (TiN), tantalum nitride (TaN), or tungsten nitride (WN). The metal may be, for example, ruthenium (Ru), Iridium (Ir), titanium (Ti), or tantalum (Ta). The conductive metal oxide may include iridium oxide (IrO). In certain embodiments, the dielectric layer 181 may include metal oxide, e.g., hafnium oxide ($HfO_2$), zirconium oxide ($ZrO_2$), aluminum oxide ($Al_2O_3$), lanthanum oxide ($La_2O_3$), tantalum oxide ($Ta_2O_3$), and/or titanium oxide ($TiO_2$). In some embodiments, the dielectric layer 181 may include perovskite dielectric material, e.g., $SrTiO_3$, (Ba, Sr)$TiO_3$ (BST), $BaTiO_3$, PZT, and/or PLZT.

A gate structure PG may be formed in the peripheral circuit region (PCR). The gate structure PG may extend from the second active region ACT2 to an upper surface of the second device isolation structure IS2. The gate structure PG may include a semiconductor layer 133, a conductive layer 134, and a capping layer 135 which are sequentially stacked on the substrate 100. The semiconductor layer 133, the conductive layer 134, and the capping layer 135 may be simultaneously formed with the bit line contacts DCC, the conductive layer 131, and the capping layer 132, which are formed in the cell array region CAR. The gate structure PG may include a second spacer SP2 extending along sidewalls of the semiconductor layer 133, the conductive layer 134, and the capping layer 135. The second spacer SP2 may be simultaneously formed with the first spacer SP1 formed in the cell array region CAR. A mask layer may be formed on the peripheral circuit region PCR when the capacitors are formed in the cell array region CAR. In some embodiments, a second interlayer insulating layer 142 may be formed on the gate structure PG. The second interlayer insulating layer 142 may include, for example, at least one of a silicon oxide layer, a silicon nitride layer, and/or a silicon oxynitride layer.

According to certain example embodiments, providing a semiconductor device according to the structure and method described above may prevent the deterioration of semiconductor device characteristics. For example, if there is no oxide layer on a substrate having a recess region, and a polysilicon layer is formed directly on the recess region, a portion of the polysilicon layer may remain on the substrate after performing an oxidation process. The remaining polysilicon layer may act as an interface trap and may cause a leakage current. In detail, the remaining polysilicon layer may cause a trap assisted tunneling, thereby some charge which is stored in a capacitor may leak due to the remaining polysilicon. According to certain example embodiments, however, a first oxide layer may be formed on the substrate before forming the polysilicon layer and the polysilicon may not remain on the substrate. As the result, this may reduce or prevent charge leakage from the capacitor to the substrate and it may increase the reliability of the semiconductor device. In addition, if the first oxide layer is deposited on the substrate, rather than being formed from oxidization of the substrate, the original area of the active regions of the substrate may be maintained, thereby improving electrical characteristics of the active regions.

Figure 9:
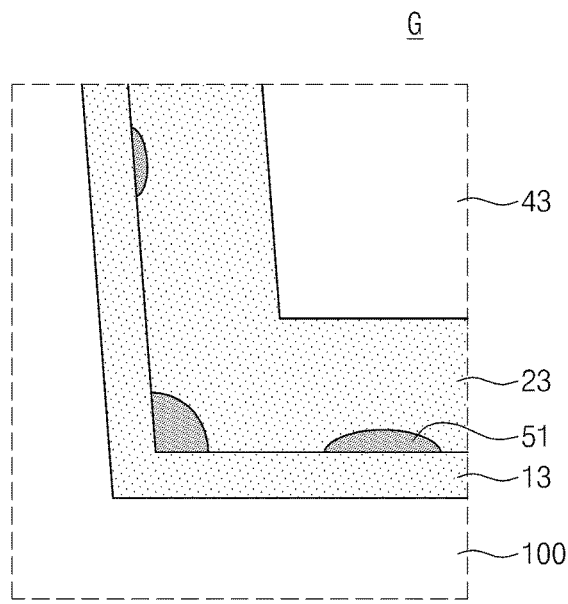
FIGS. 9 and 10 are macrography of region G in FIG. 8, according to certain example embodiments.
Figure 10:
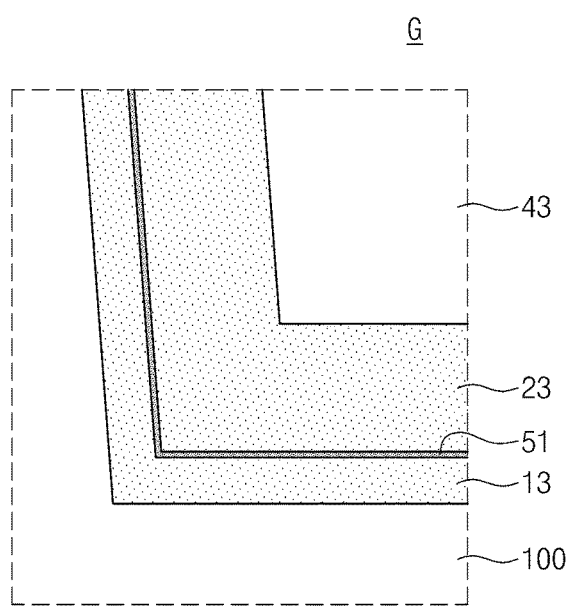

FIGS. 9 and 10 are macrography of region G in FIG. 8. According to an example embodiment, some portion of the polysilicon layer may remain between the first oxide layer 13 and the second oxide layer 23. The remaining polysilicon 51 may have an isolated structure between the first oxide layer 13 and the second oxide layer 23 as shown in FIG. 9 or may have a layer structure between the first oxide layer 13 and the second oxide layer 23 as shown in FIG. 10.

If the remaining polysilicon 51 has an isolated structure as shown in FIG. 9, the remaining polysilicon 51 may have strong likelihood of being positioned in the corner of the recess region. The remaining polysilicon 51 may have a diameter or thickness from about 5 Å to about 20 Å. In some embodiments, the remaining polysilicon 51 may be positioned in the peripheral circuit region PCR as well as in the cell array region CAR. The oxidization of the polysilicon layer described, for example, in FIGS. 5A and 5B, may be therefore controlled to allow for some of the original non-oxidized polysilicon layer to remain.

The remaining polysilicon 51 positioned in the peripheral circuit region PCR may reduce a phenomenon of hot electron induced punch-through (HEIP) of the semiconductor device. The peripheral circuit region PCR unlike the cell array region CAR may be composed of a CMOS transistor. Thereby, the peripheral circuit region PCR may include a PMOS transistor.

If a higher electric field is induced into a channel region of a PMOS transistor, hot electrons, which have an energy level greater than an average energy level, may be generated. The hot electrons may generate an electron-hole pair (EHP) by colliding with some atoms of semiconductor substrate and by ionizing the atoms of semiconductor substrate. The hot electrons having a higher level energy may inject into the gate dielectric layer and may be trapped therein. The hot electrons may also inject into a sidewall oxide layer or a liner layer (e.g., silicon nitride layer) and may be trapped therein. Therefore, a phenomenon of HEIP may be generated and it may generate a leakage current. The leakage current may flow along the interface between the gate electrode and an active region thereunder and it may reduce a channel length of the PMOS transistor. For example, an electrical channel length of the PMOS transistor may be reduced even though the physical channel length thereof is not changed.

According to an example embodiment, the remaining polysilicon 51 positioned in the peripheral circuit region PCR may reduce the phenomenon of hot electron induced punch-through (HEIP) by absorbing the hot electrons and neutralizing them. For example, the remaining silicon may be formed in some areas like corners.

Figure 11A:
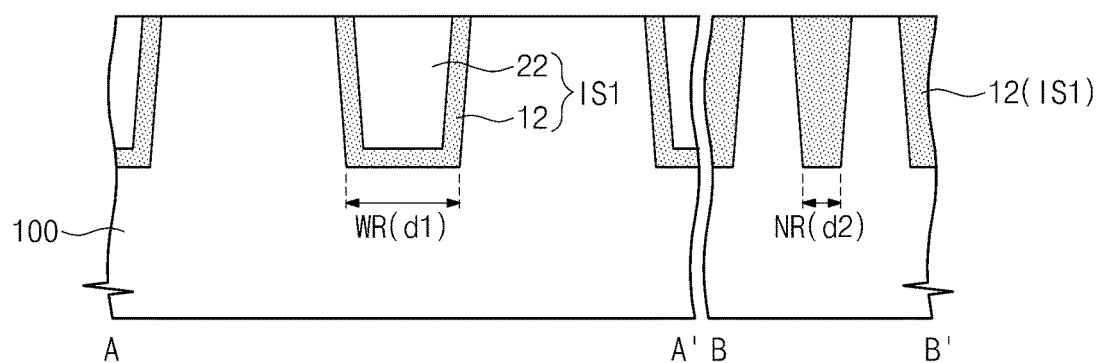
FIG. 11a is a cross-sectional view illustrating a method of manufacturing a device isolation structure taken along the lines A-A' and B-B' of FIG. 2, according to certain example embodiments.
Figure 11B:
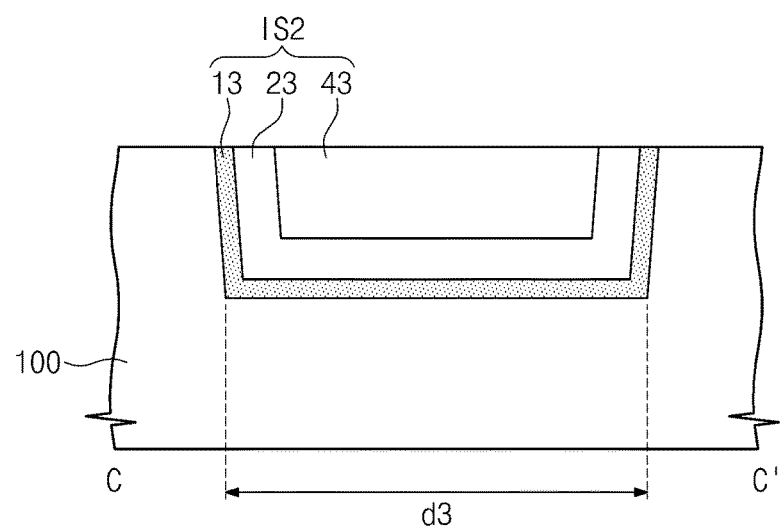
FIG. 11b is a cross-sectional view illustrating a method of manufacturing a device isolation structure taken along the lines C-C' of FIG. 2, according to certain example embodiments.

FIG. 11a is a cross-sectional view illustrating a method of manufacturing a device isolation structure taken along the lines A-A' and B-B' of FIG. 2. And FIG. 11b is a cross-sectional view illustrating a method of manufacturing a device isolation structure taken along the lines C-C' of FIG. 2. For convenience of description, some of explanation which is substantially the same description as previously described will be omitted.

Referring to FIGS. 11a and 11b, the first device isolation structure IS1 formed in the wide width region WR may include the first oxide layer 12 and the second oxide layer 22 and the first device isolation structure IS1 formed in the narrow width region NR may include the first oxide layer 12. The first device isolation structure IS1 may not include the second oxide layer 22 in the narrow width region 22. By increasing the degree of integration, the narrow width region NR may be smaller and the gap-fill layer may not be included in the cell array region CAR. However, the second device isolation structure IS2 formed in the peripheral circuit region PCR may include the gap-fill layer. Therefore, in some embodiments, the second device isolation structure IS2 may include a first number of oxide layers greater than a second number of oxide layers which are included in the wide width region WR of the cell array region CAR. In other embodiments, the second device isolation structure IS2 may include a first number of oxide layers equal to a second number of oxide layers which are included in the wide width region WR of the cell array region CAR. Therefore, in some embodiments, portions of the first device isolation structure IS1 (e.g., narrow width regions NR) may include only one oxide layer and the second device isolation structure IS2 may include two oxide layers, but in other embodiments, all portions of the first device isolation structure IS1 (e.g., both narrow width regions NR and wide width regions WR) include two oxide layers, and the second device isolation structure IS2 also includes the same two oxide layers.

Figure 12:
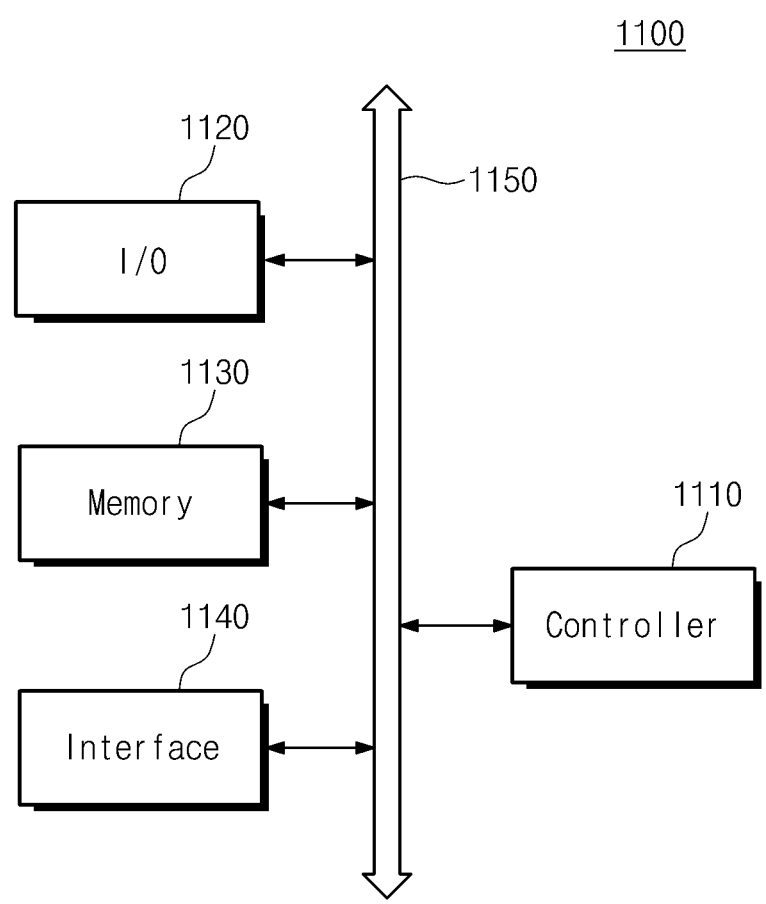
FIG. 12 is a block diagram illustrating an electronic system including a semiconductor device according to certain example embodiments.

FIG. 12 is a block diagram illustrating an electronic system including a semiconductor device according to an example embodiment of the inventive concepts.

Referring to FIG. 12, the electronic system 1100 may include a controller 1110, an input/output device 1120, a memory device 1130, an interface 1140 and a bus 1150. The electronic system 1100 may transmit or receive mobile system information. The mobile system may be an electronic device, such as for example, a PDA, portable computer, web tablet, wireless phone, mobile phone, digital music player, or memory card.

The controller 1110 may execute a program and control the electronic system 1100. The controller 1110 may be a microprocessor, a digital signal processor, a microcontroller or device similar thereto.

The input/output device 1120 may be used to input or output data to or from the electronic system 1100. The electronic system 1100 may be connected to an external device, for example, a personal computer or networks and may exchange data with the external device. The input/output device 1120 may be a keypad, a keyboard, or a display device.

The memory device 1130 may store a code and/or data for operating the controller 1110 and/or store data having been processed by the controller 1110. The memory device 1130 may be or may include a semiconductor device according to one of the example embodiments of the present inventive concept.

The interface 1140 may be used as a data transmission path between the electronic system 1100 and an external device. The controller 1110, the input/output device 1120, the memory device 1130, and the interface 1140 may communicate with each other via the bus 1150.

At least one of the controller 1110 or the memory device 1130 may include at least one of the semiconductor devices described with reference to FIGS. 1 through 11b.

Figure 13:
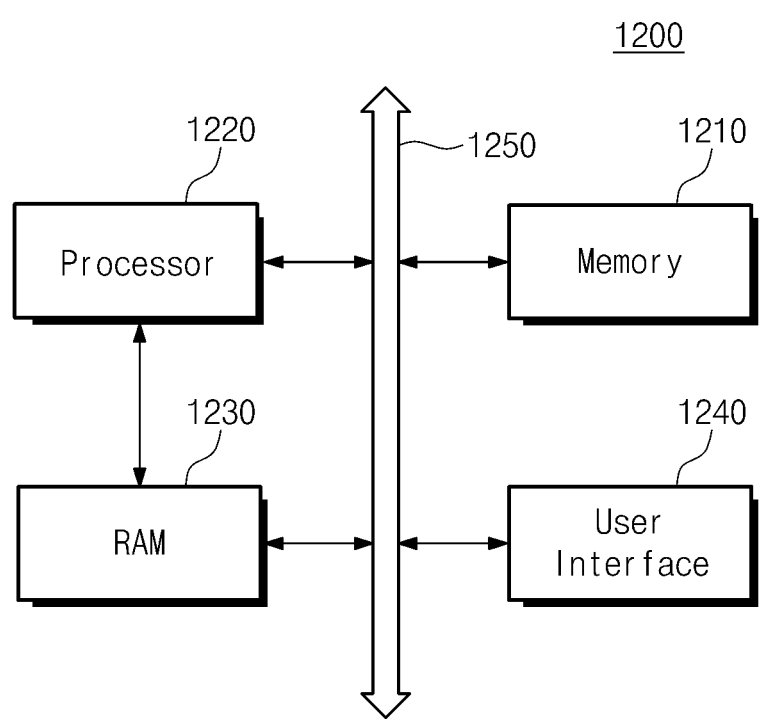
FIG. 13 is a block diagram illustrating an electronic system including a semiconductor device according to certain example embodiments.

FIG. 13 is a block diagram illustrating an electronic system including a semiconductor device according to an example embodiment of the inventive concepts.

Referring to FIG. 13, the electronic system 1200 may comprise a memory device 1210 including one of the semiconductor devices according to the example embodiments of the inventive concepts as mentioned above. The memory device 1210 may be connected via a bus 1250. The electronic system 1200 may further comprise a processor 1220, a random access memory (RAM) 1230, and a user interface 1240 which are connected via the bus 1250. The memory device 1210, the processor 1220, the random access memory (RAM) 1230, and the user interface 1240 may communicate with each other via the bus 1250. The processor 1220 may communicate directly with the RAM 1230 without the bus 1250. The processor 1220 may execute a program and control the electronic system 1100. The RAM 1230 may be used as an executing memory for the processor 1220. The RAM 1230 may include at least one of semiconductor devices according to the example embodiments of the inventive concepts as mentioned above. The user interface 1240 may be used as a data transmission path between the electronic system 1200 and an external device. The memory device 1210 may store some codes for operating the processor 1220, some data processed by the processor 1220, and some input data from an external device. The memory device 1210 may include a controller therein.

The electronic system 1200 may be applied to a product, e.g., a personal digital assistant (PDA), a portable computer, a web tablet, a mobile phone, a wireless phone, a laptop computer, a memory card, or a digital music player. The electronic system 1200 may be also applied to a 3G communication system, e.g., CDMA, GSM, NADC, E-TDMA, WCDMA, or CDMA2000.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A method of manufacturing a semiconductor device, the method comprising:
   forming a plurality of recess regions on an upper surface of a substrate;
   forming a first oxide layer in the recess regions;
   forming a polysilicon layer on the first oxide layer;
   forming a second oxide layer by oxidizing the polysilicon layer; and
   forming a gap-fill layer on the second oxide layer to fill the recess regions,
   wherein at least a portion of the polysilicon layer remains between the first oxide layer and the second oxide layer after forming the second oxide layer,
   wherein the portion of the polysilicon layer has an isolated structure between the first oxide layer and the second oxide layer, and wherein at least a portion of the first oxide layer contacts the second oxide layer in at least one of the recess regions.

2. The method of claim 1, wherein the first oxide layer is formed by using an atomic layer deposition process.

3. The method of claim 2, wherein the first oxide layer has a first thickness and the second oxide layer has a second thickness greater than the first thickness.

4. The method of claim 1, wherein the substrate comprises a cell array region and a peripheral circuit region,
the recess regions include a first recess region in the cell array region and a second recess region in the peripheral circuit region, and
the first recess region includes a plurality of active regions extending in a first direction and includes recesses between the active regions, wherein a maximum distance between active regions in either the first direction or a second direction perpendicular to the first direction is a first width; and
the second recess region includes a plurality of active regions and at least one recess therebetween, and a minimum distance between active regions is a second width greater than the first width.

5. The method of claim 4, further comprising forming a first device isolation structure in the first recess region and a second device isolation structure in the second recess region,
wherein the first device isolation structure comprises the first oxide layer, the second oxide layer, and the gap-fill layer, and
wherein the second device isolation structure comprises the first oxide layer, at least a portion of the polysilicon layer, the second oxide layer, and the gap-fill layer.

6. The method of claim 4, wherein the cell array region comprises a plurality of first active regions divided by a first device isolation structure,
the first recess region has a wide width region and a narrow width region,
the wide width region has a first space between adjacent ones of the first active regions, and
the narrow width region has a second space between adjacent ones the first active regions, the second space being smaller than the first space.

7. The method of claim 6, wherein the wide width region extends in the first direction, and
the narrow width region extends in the second direction.

8. The method of claim 6, wherein the narrow width region of the first recess region is filled by the first oxide layer and the second oxide layer, and
the wide width region of the first recess region is filled by the first oxide layer, the second oxide layer, and the gap-fill layer.

9. The method of claim 6, further comprising forming a plurality of capacitors electrically connecting to the first active regions.

10. The method of claim 6, further comprising:
forming a plurality of word lines crossing the first active regions, the word lines being embedded in the substrate; and
forming a plurality of bit lines crossing the word lines, the bit lines electrically connecting to the first active regions.

11. A method of manufacturing a semiconductor device, the method comprising:
providing a substrate including a cell array region and a peripheral circuit region;
forming a first recess region in the cell array region, the first recess region defining a plurality of first active regions that extend in a first direction and are formed to be parallel to each other;
forming a first oxide layer in the first recess region using an atomic layer deposition process;
forming a polysilicon layer on the first oxide layer, the polysilicon layer at least partially filling the first recess region;
forming a second oxide layer by oxidizing the polysilicon layer; and
forming a gap-fill layer on the second oxide layer,
wherein the first recess region includes a wide width region and a narrow width region, the wide width region having a first space between adjacent ones of the first active regions and the narrow width region having a second space between adjacent ones of the first active regions, the second space being smaller than the first space;
wherein the narrow width region is filled by the first oxide layer and the second oxide layer; and
wherein the wide width region is filled by the first oxide layer, the second oxide layer, and the gap-fill layer, which is not included in the narrow width region,
wherein at least a portion of the polysilicon layer remains between the first oxide layer and the second oxide layer after forming the second oxide layer, and at least a portion of the polysilicon layer does not remain between the first oxide layer and the second oxide layer after forming the second oxide layer.

12. The method of claim 11, wherein the wide width region extends in the first direction, and
the narrow width region extends in a second direction, the second direction extending perpendicular to the first direction.

13. The method of claim 11, wherein the oxidizing the polysilicon layer is performed by using an ISSG (In-situ Steam Generation) process.

14. The method of claim 11, further comprising:
forming a plurality of word lines crossing the first active regions in the substrate;
forming a plurality of capacitors electrically connecting to the first active regions; and
forming a plurality of bit lines crossing the word lines, the bit lines electrically connecting to the first active regions.

15. The method of claim 11, further comprising forming a second recess region in the peripheral circuit region,
wherein the second recess region is filled by the first oxide layer, the second oxide layer, and the gap-fill layer.

* * * * *